United States Patent
Barr et al.

(10) Patent No.: US 6,937,039 B2
(45) Date of Patent: Aug. 30, 2005

(54) TIP AND TIP ASSEMBLY FOR A SIGNAL PROBE

(75) Inventors: Andrew Harvey Barr, Roseville, CA (US); Gary Logan, Orangevale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/447,693

(22) Filed: May 28, 2003

(65) Prior Publication Data

US 2004/0239348 A1 Dec. 2, 2004

(51) Int. Cl.[7] ............................................. G01R 31/02
(52) U.S. Cl. ........................................ 324/754; 324/761
(58) Field of Search ................................ 324/72.5, 754, 324/758, 761–762; 439/169, 174, 482, 912; 29/825, 827, 883–884

(56) References Cited

U.S. PATENT DOCUMENTS

| | | | | |
|---|---|---|---|---|
| 3,891,924 A | * | 6/1975 | Ardezzone et al. ......... 324/762 |
| 4,923,407 A | * | 5/1990 | Rice et al. .................... 439/92 |
| 4,983,908 A | * | 1/1991 | Tada et al. ................... 324/754 |
| 5,938,452 A | * | 8/1999 | Wojnarowski .............. 439/67 |
| 6,332,270 B2 | * | 12/2001 | Beaman et al. .............. 29/844 |
| 6,441,621 B2 | * | 8/2002 | Nagata ........................ 324/537 |
| 6,759,858 B2 | * | 7/2004 | Roggel ........................ 324/754 |
| 6,828,768 B2 | * | 12/2004 | McTigue ................... 324/72.5 |

* cited by examiner

*Primary Examiner*—Minh N. Tang

(57) ABSTRACT

A signal probe includes a tip assembly having a first tip for contacting a first signal node, a second tip for contacting a second signal node, and a tip body for positioning the first tip a distance away from the second tip, the distance corresponding to the spacing between the first and second signal nodes. With the tip body, a technician no longer has to couple a wire between one of the signal nodes and a respective tip to probe the electronic device. Thus, the length of the path that a signal travels from the first signal node to the second signal node may be reduced to increase the accuracy of the signal's measurement.

26 Claims, 3 Drawing Sheets

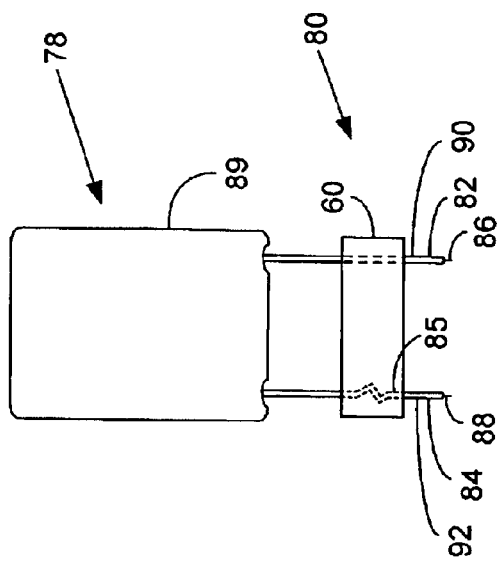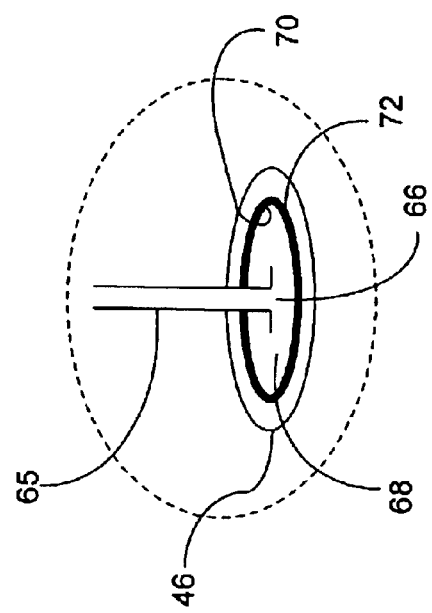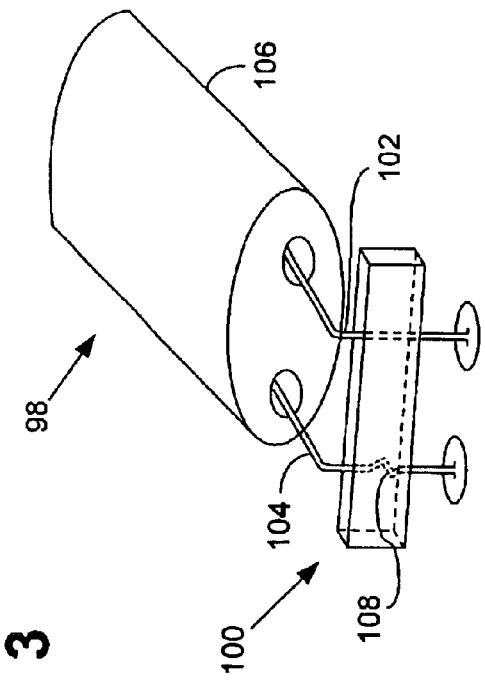

TIP AND TIP ASSEMBLY FOR A SIGNAL PROBE

BACKGROUND

Many electronic devices, such as computers, include a circuit board that contains the device's circuitry and/or components for operating the device. The circuit board typically includes many electrical circuits and at least one component such as a processor, power supply or memory chip mounted to it. When electronic devices malfunction or when the design or manufacture of the device is not complete, a technician typically tests/diagnosis the device by probing the nodes of the device's circuit board with a probe coupled to a measuring device, such as an oscilloscope.

Many of the tests/diagnosis require a technician to measure high-frequency signals generated in a circuit and/or component of the device. To probe a device's circuit board to measure high-frequency signals, a technician typically contacts a short signal lead of an active probe, i.e., a probe having circuitry within the probe body, to a pad or other accessible contact of the signal node. In addition, the technician typically contacts a second conductive lead of the probe to a ground of the circuit board, which may be located anywhere on the circuit board, to ground the probe. Furthermore, to accurately measure high-frequency signals, the leads of the probe must typically remain in contact with the signal nodes. Thus, probing an electronic device typically requires the technician to use one of his/her hands to support the probe and keep the probe still.

For example, FIG. 1 shows a conventional active probe 10 for probing a component (omitted for clarity) of a circuit board 12. The probe 10 includes a body 14 having circuitry (omitted for clarity) to measure or condition a high-frequency signal, a signal tip 16 to convey the high-frequency signal to the circuitry, and a ground tip 18 for grounding the probe 10 and providing a return path forth measured signal. The circuit board 12 includes an array of pads 20, the array including a signal pad 22 and a ground pad 24. For example, the array 20 is a conventional ball-grid array (BGA) with spacing between adjacent pads in the X and Y directions equal to 0.040 inches. The signal tip 16 may be soldered to the signal pad 22 to maintain contact between the signal tip and the pad 22. Because the spacing between the signal tip 16 and the ground tip 18 is typically greater than the spacing between the pads 22 and 24, a wire 30 is typically soldered to the tip 18 and the ground pad 24 to couple the ground tip to the pad 24. While measuring a high-frequency signal, the signal travels from the pad 22, through the signal tip 16, and through the ground tip 18 and wire 30 to the ground pad 24.

To accurately measure a high-frequency signal, the tip 16 should remain in contact with the pad 22, and the length of the path that the signal travels from the signal pad 22, through the tips 16 and 18 and wire to the ground pad 24 should be minimized. If contact is not maintained, the signal sensed by the probe may be degraded or lost. Reducing the path length of the signal reduces noise in the signal that can be picked up from other components and/or circuits in the circuit board 12 or elsewhere, and that can adversely affect the fidelity of the high-frequency signal received by the probe.

Unfortunately, accurate high-frequency measurements are sometimes difficult to make with the probe 10. The length of the path that the high-frequency signal travels from the signal node 22 to the ground node 24 includes the length of the wire 30. Frequently, this additional length is enough to corrupt the high-frequency signal being measured.

Furthermore, soldering the point 26 of the signal tip 16 to the pad 22 often does not effectively support the probe 10. For example the probe body 14 can easily tip and break the solder joint if a technician does not hold the probe 10 still. Thus, the technician often has to hold the probe 10 still with his/her hand to probe the circuit board 12, even though the tip 16 may be soldered to the pad 22.

Holding the probe with a hand while testing/diagnosing an electronic device is often clumsy and awkward. Frequently, testing/diagnosing requires a technician to probe a circuit and/or component for long periods of time, and thus often requires the technician to hold the probe for a long period of time to complete the test/diagnosis. Holding the probe for a long period frequently tires the technician's hand, wrist and/or arm, which can cause the technician to allow the probe body to move and thus break the connection between the probe's lead and the signal node. In addition, testing/diagnosing an electronic device frequently requires a technician to operate the controls of the measuring device (oscilloscope) while probing the circuit and/or component. This often causes the technician to lose his/her concentration on maintaining contact between the probe and the signal node of the component.

SUMMARY

In one aspect of the invention, a signal probe includes a tip assembly having a first tip for contacting a first signal node, a second tip for contacting a second signal node, and a tip body for positioning the first tip a distance away from the second tip, the distance corresponding to the spacing between the first and second signal nodes. With the tip body, a technician no longer has to couple a wire between one of the signal nodes and a respective tip to probe the electronic device. Thus, the length of the path that a signal travels from the first signal node to the second signal node may be reduced to increase the accuracy of the signal's measurement.

In addition, one or both of the tips may include a base that may be attached to a signal node to secure the tip to the signal node. With the base, a technician can support the signal probe while probing an electronic device without having to hold the probe still to maintain contact between the tip and the signal node.

BRIEF DESCRIPTION OF THE FIGURES

FIG. 3 is a perspective, partial view of a tip of FIG. 2 coupled to a pad of the circuit board in FIG. 2, according to an embodiment of the invention.

FIG. 4 is a view of a probe having a probe-tip assembly according to another embodiment of the invention.

FIG. 5 is a perspective view of a probe having a probe-tip assembly according to yet another embodiment of the invention.

DETAILED DESCRIPTION

The following discussion is presented to enable one skilled in the art to make and use the invention. Various modifications to the disclosed embodiments will be readily apparent to those skilled in the art, and the generic principles herein may be applied to other embodiments and applications without departing from the spirit and scope of the present. Thus, the present invention is not intended to be limited to the embodiments shown, but is to be accorded the widest scope consistent with the principles and features disclosed herein.

Figure 1:
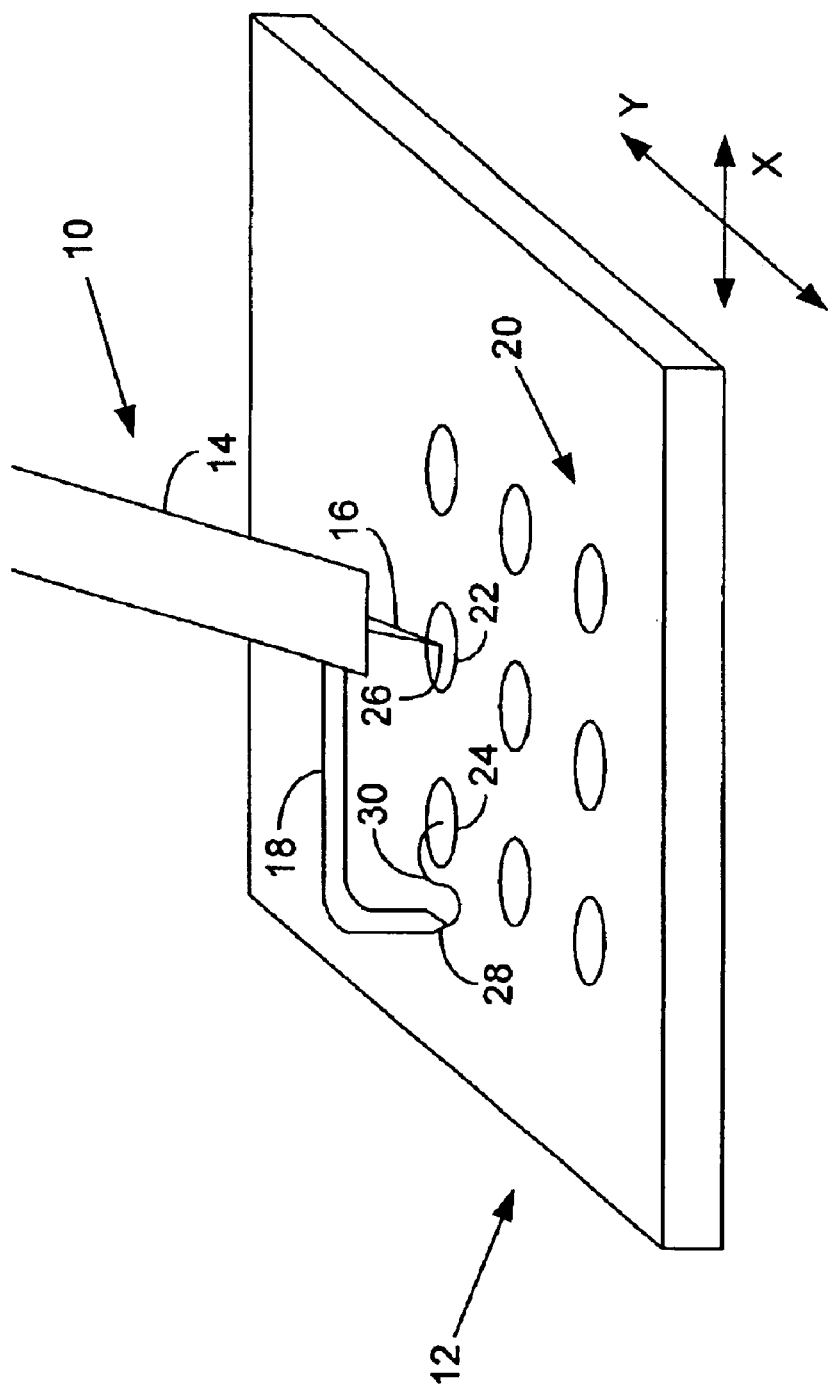
FIG. 1 is a perspective view of a conventional probe-tip assembly having signal and ground tips coupled to two signal nodes of a circuit board.
Figure 2:
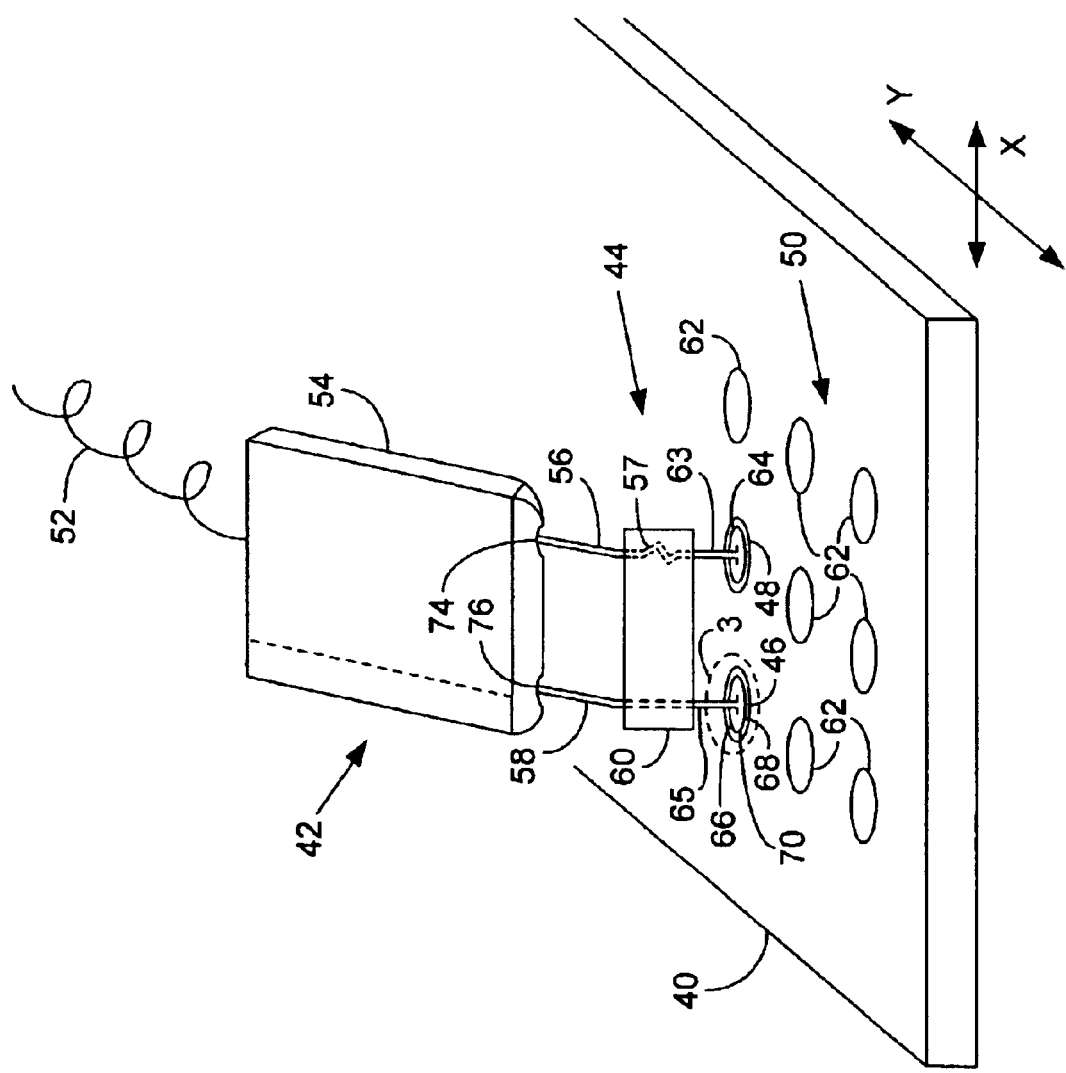
FIG. 2 is a perspective view of a probe-tip assembly having signal and ground tips attached to respective pads of a circuit board according to an embodiment of the invention.

FIG. 2 is a perspective view of a circuit board 40 incorporated in an electronic device (omitted for clarity), and a probe 42 having a probe-tip assembly 44, according to an embodiment of the invention. As discussed below, the probe 42 is secured to two pads 46 and 48 of a pad array 50, which allows a technician to probe one or more signal nodes of a circuit (not shown) and/or component (not shown) of the circuit board 40 without holding the probe. The probe 42 receives an electrical signal, which is typically a high-frequency signal but may be another type of signal, via the pads 46 and 48, and the cable 52 couples the probe 42 to an oscilloscope (not shown) or other electronic device that receives the probed signal. The probe 42 may be an active probe, that includes circuitry (not shown) within the probe body 54 for measuring high-frequency signals, or may also be a passive probe. With the probe-tip assembly 44, a technician can secure the probe 42 to two signal nodes while reducing the length of the path the probed signal travels to and from the probe body 54, and thus reduce noise that may corrupt the measurement of the probed signal.

The probe-tip assembly 44 includes a signal tip 56 for contacting the pad 48, and a ground tip 58 for contacting the pad 46. The signal tip 56 may include a resistor 57 to reduce noise caused by signal ringing if the probe 42 is an active probe, or to increase the impedance of the probe 42 if the probe 42 is a passive probe. In other embodiments, another component such as a capacitor (not shown) may take the place of the resistor 57, or the resistor 57 and component may be omitted. The probe-tip assembly 44 also includes a tip body 60 to fixedly or adjustably position the tip 56 a distance away from the tip 58, the distance corresponding to the spacing between the pads 46 and 48. The pad array 50 includes the pads 46, 48, and 62 that are each spaced a distance apart from adjacent pads in the array 50 in the X and Y directions. The distance that each pad 46, 48 and 62 is spaced apart from an adjacent pad in the X and Y directions can vary within an array or relative to different arrays. For example, the pad array 50 may be a ball grid array (BGA) of pads or a land grid array (LGA) of pads having each pad spaced approximately 0.040 inches apart in the X and/or Y direction, or approximately 0.050 inches apart in the X and/or Y directions. Thus, in one embodiment of the probe-tip assembly 44, the tip body 60 may position the tip 56 approximately 0.040 inches away from the tip 58 to provide a relatively short path for the probed signal to travel. And, in another embodiment of the probe-tip assembly 44, the tip body 60 may position the tip 56 approximately 0.050 inches away from the tip 58. And, if the probed pads in a pad array 50 with 0.040 or 0.050 spacing are located diagonally adjacent each other the tip body 60 may fixedly or adjustably position the tip 56 0.040√2 inches or 0.050√2 inches away from the tip 58.

The tip body 60 may be made of any desirable material and the tips 56 and 58 may be anchored to the body 60 using any desirable technique. For example, the tip body 60 may be made of any non-conductive plastic material to insulate both tips 56 and 58 from each other. Furthermore, the tip body 60 may be formed around the tips 56 and 58 using conventional injection molding techniques. In other embodiments, the tip body 60 may be made of conventional rubber and the tips 56 and 58 may be mounted to the outside of the tip body 60 using conventional fastening techniques.

Other embodiments of the tip body 60 are contemplated. For example, the tip body 60 may include an adjustment mechanism that allows a technician to change the distance between the tips 56 and 58, respectively. This may be desirable when the technician is browsing, i.e., probing a circuit and/or component for a short period of time and then probing another, and the different circuits and/or components being browsed have different pad spacings or, this may be desireable when probing pads that are laterally and distinctly spaced.

Still referring to FIG. 2, the tips 56 and 58 each include a respective extension 63 and 65 to which a respective flat base 64 and 66 are attached, and may be made of any desirable conductive material such as steel according to an embodiment of the invention. Each base 64 and 66 may be fastened to the respective one of the pads 48 and 46 using any desired fastening technique to secure the tip of 56 and 58 to the circuit board 40. As shown in FIG. 2, the base 66 of the tip 58 is similar to the base 64 of the tip 56, and thus the following discussion of the base 66 also applies to the base 64. As shown in FIGS. 2 and 3, in one embodiment, the base 66 is a substantially circular disc 68 having a perimeter 70 and a substantially flat surface (not shown) that forms an interface with the pad 46 when the base 66 is fastened to the pad 46. In one embodiment, to fasten the base 66 to the pad 46, a bead of solder 72 (shown in FIG. 3 only) may be melted and then allowed to harden in contact with the perimeter 70 and pad 46. By fastening the base 66 to the pad 46 at the perimeter 70 and not beneath where the extension 65 is attached to the base 66, the attachment of the ground tip 58 to the pad 46 can better resist movement of the probe 42 relative to the pad 46 that would normally cause the tip 58 to separate from the pad 46. And thus, a technician does not have to hold the probe to maintain electrical contact between the tip 58 and the pad 46.

Other embodiments of the base 66 and different techniques for fastening the base 66 to the pad 46 are contemplated. For example, the base may have another shape, such as that of a square disc or shaped like a tear drop, and the base may be fastened to the pad 46 using any conductive adhesive.

Still referring to FIG. 2, the probe-tip assembly 44 may be attached to the probe body 54 using any desired technique. Furthermore, the probe-tip assembly 44 may be removable and replaceable from the probe body 54. This may be desirable when probing different circuits and/or components of a circuit board that have corresponding pads spaced different distances apart. In one embodiment, the probe body 54 includes a clamp (not shown) that frictionally holds the tips 56 and 58 to the probe body 54. To attach the tips 56 and 58, an end (not shown) of each tip 56 and 58 is inserted through one of the two openings 74 and 76 of the probe body 54 and into a jaw (not shown) of the clamp. The clamp may include a spring (not shown) to bias the jaws in a closed position such that, when the ends of the tips 56 and 58 are inserted into the jaw, the jaw exerts pressure against the ends to hold the tips 56 and 58.

Other fastening techniques are contemplated. For example, the probe-tip assembly 44 may be attached to a coaxial cable with a subminiature version A connector (SMA connector). This may be desirable when other electronic devices that include coaxial cable to receive a probed signal are used. Or, the probe-tip assembly 44 may be attached to a coaxial cable with a Bayonet Neill Concelman connector (BNC connector). This may be desirable to quickly connect and disconnect the tip assembly 44 from the coaxial cable.

FIG. 4 is a view of a probe 78 that includes a probe-tip assembly 80 according to another embodiment of the invention. The probe-tip assembly 80 includes tips 82 and 84, each having a respective point 86 and 88, that have approximately the pad spacing shown and discussed in conjunction with FIG. 2 and that may be retracted toward the probe body 89 relative to the respective one of the tips 82 and 84. Furthermore, each of the points 86 and 88 may be biased away from the probe body 89 of the probe 78. The probe-tip assembly 80 may be desirable for browsing different circuits and/or components of an electronic device, because attaching the bases 64 and 66 of the tips 56 and 58 in FIGS. 2 and 3 to many different pads might require significant time and effort, and thus may be inefficient for browsing.

In one embodiment, the tip 84 includes a resistor 85 to reduce noise caused by signal ringing if the probe 78 is an active probe, or to increase the impedance of the probe 78 if the probe 78 is a passive probe. Furthermore, the tips 82 and 84 each include a tip body 90 and 92, respectively, and a spring (not shown) disposed in each of the tip bodies 90 and 92 to bias the points 86 and 88 away from the probe body 89. Each spring may be fastened to the respective one of tip bodies 90 and 92 and fastened to the respective one of the points 86 and 88 such that each spring is disposed between the respective one of the bodies 90 and 92 and the respective one of the points 86 and 88. When a technician exerts pressure on the probe 78 after contacting the pads 46 and 48 (FIG. 3) with the points 86 and 88, the points 86 and 88 slide within the respective one of the bodies 90 and 92.

Other embodiments of the probe 78 are contemplated. For example, the tips 82 and 84 may be retractable relative to the probe body 89.

FIG. 5 is a perspective view of a probe 98 that includes a probe-tip assembly 100 according to yet another embodiment of the invention. The probe-tip assembly 100 is similar to the probe-tip assembly 44 in FIG. 2 except that the tips 102 and 104 are configured to angularly position the probe-tip assembly 100 relative to the probe body 106.

In one embodiment, the signal tip 104 includes a resistor 108 to reduce noise caused by signal ringing if the probe 98 is an active probe, or to increase the impedance of the probe 98 if the probe 98 is a passive probe. In addition, the signal and ground tips 102 and 104 are rigid and bent substantially 90° to allow a technician to probe a circuit and/or component of an electronic device that may be difficult to access and probe with the probe 42 (FIG. 2). Furthermore, a technician can probe a circuit and/or component of an electronic device without having to hold the probe body 106 to support the probe 98. The probe-tip assembly 100 may be fastened to respective pads 46 and 48 as discussed above in conjunction with FIGS. 2 and 3, and the probe body 106 may be supported by blocks (not shown) resting on the circuit board 40 (FIG. 2).

Other embodiments of the probe-tip assembly 100 are contemplated. For example, the bent angle of the probe-tip assembly 100 may be adjustable as discussed in U.S. patent application Ser. No. 10/417,848 titled ELECTRONIC PROBE WITH POSITIONABLE TIP and filed 16 Apr. 2003, which is incorporated by reference.

What is claimed is:

1. A signal-probe tip assembly comprising:
   a first tip having an first extension, and operable to contact a first signal node;
   a second tip having a second extension, and operable to contact a second signal node;
   a tip body operable to adjustably position the first tip a distance away from the second tip, the distance corresponding to the between the two signal nodes; and
   wherein at least one of the first and second tips includes a base attached to the respective extension, the base being wider than the respective extension and solderable to the respective signal node.

2. The tip assembly of claim 1 wherein the distance between the first and second tips is substantially 0.04 inches.

3. The tip assembly of claim 1 wherein the distance between the first and second tips is substantially 0.05 inches.

4. The tip assembly of claim 1 wherein the distance between the first and second tips is substantially $0.04\sqrt{2}$ inches.

5. The tip assembly of claim 1 wherein the distance between the first and second tips is substantially $0.05\sqrt{2}$ inches.

6. The tip assembly of claim 1 wherein the first and second tips each includes a base attached to the respective extension, the base being wider than the respective extension and solderable to the respective signal node.

7. The tip assembly of claim 1 wherein the base is substantially circular and includes a perimeter that is solderable to the respective signal node.

8. The tip assembly of claim 1 wherein one of the first and second tips includes a retractable point.

9. The tip assembly of claim 1 wherein at least one of the first and second tips includes a series resistor.

10. The tip assembly of claim 1 wherein the second tip comprises a ground tip and the second signal node comprises a ground node.

11. The tip assembly of claim 1 wherein the tip body includes a non-conductive plastic material.

12. The tip assembly of claim 1 wherein the base has a substantially flat surface operable to contact the respective signal node.

13. The tip assembly of claim 1 wherein the respective extension is attached to a middle of the base.

14. The tip assembly of claim 1 wherein the base is more than twice as wide as the extension.

15. A signal probe comprising:
   a probe body; and
   a signal-probe tip assembly attached to the body and including,
      a first tip having a first extension, and operable to contact a first signal node,
      a second tip having a second extension, and operable to contact a second signal node,
      a tip body operable to adjustably position the first tip a distance away from the second tip, the distance corresponding to the spacing between the two signal nodes, and
      wherein at least one of the first and second tips includes a base attached to the respective extension, the base being wider than the respective extension and solderable to the respective signal node.

16. The probe of claim 15 wherein the tip assembly is releasably attachable to the probe body.

17. The probe of claim 15 wherein the tip assembly is angularly positioned relative to the probe body.

18. The probe of claim 15 wherein the tip assembly is angularly positioned 90° relative to the probe body.

19. The probe of claim 15 wherein the probe comprises an active probe.

20. An electronic system for probing first electronic device, the system comprising:

a second electronic device operable to process a probed signal; and a signal probe operable to be coupled to the second electronic device and including:
- a probe body; and
- a signal-probe tip assembly attached to the body and having
  - a first tip including a first extension, and operable to contact a first signal node that carries the signal,
  - a second tip including a second extension, and operable to contact a second signal node,
  - a tip body operable to adjustably position the first tip a distance away from the second tip, the distance corresponding to the spacing between the two signal nodes, and
  - wherein at least one of the first and second tips includes a base attached to the respective extension, the base being wider than the respective extension and solderable to the respective signal node.

21. The system of claim 20 wherein the second electronic device comprises an oscilloscope.

22. A method comprising:

contacting a first signal node with a first probe tip that has a first extension; positioning a second probe tip that has a second extension a distance from the first probe tip, the distance corresponding to the distance between the first signal node and a second signal node;

contacting the second signal node with the second probe tip;

attaching a base of the first probe tip or a base of th second probe tip to the first signal node or the second signal node, respectively, wherein the base of the first probe tip or the base of the second probe tip is wider than the respective extension.

23. The method of claim 22 wherein attaching the base includes soldering the base to the respective signal node.

24. The method of claim 22 wherein contacting the first and second signal nodes include pushing the first and second tips against the first and second nodes, respectively.

25. The method of claim 22 further comprising:

analyzing a signal on at least one of the nodes.

26. The method of claim 22 wherein attaching the base includes soldering a perimeter of the base to the respective node.

* * * * *

UNITED STATES PATENT AND TRADEMARK OFFICE
CERTIFICATE OF CORRECTION

PATENT NO. : 6,937,039 B2 Page 1 of 1
APPLICATION NO. : 10/447693
DATED : August 30, 2005
INVENTOR(S) : Andrew Harvey Barr et al.

It is certified that error appears in the above-identified patent and that said Letters Patent is hereby corrected as shown below:

IN THE SPECIFICATION

Column 5, line 26, delete "of tip" and insert therefor --of the tip--

IN THE CLAIMS

Claim 1, Column 5, line 66, after "having" delete "an" and insert therefor --a--

Claim 1, Column 6, line 5, after "to the" insert --spacing--

Claim 22, Column 8, line 7, delete "th" and insert therefor --the--

Signed and Sealed this

Sixteenth Day of October, 2007

JON W. DUDAS
*Director of the United States Patent and Trademark Office*